US012648260B2

(12) United States Patent
Zhang et al.

(10) Patent No.: US 12,648,260 B2
(45) **Date of Patent: \*Jun. 2, 2026**

(54) SOLAR CELL, METHOD FOR PREPARING THE SAME, AND PHOTOVOLTAIC MODULE

(71) Applicants: JINKO SOLAR CO., LTD., Jiangxi (CN); ZHEJIANG JINKO SOLAR CO., LTD., Haining (CN)

(72) Inventors: Yuanfang Zhang, Jiangxi (CN); Peiting Zheng, Jiangxi (CN); Jie Yang, Jiangxi (CN); Xinyu Zhang, Jiangxi (CN)

(73) Assignees: ZHEJIANG JINKO SOLAR CO., LTD., Haining (CN); JINKO SOLAR CO., LTD., Jiangxi (CN)

( \* ) Notice: Subject to any disclaimer, the term of this patent is extended or adjusted under 35 U.S.C. 154(b) by 7 days.

This patent is subject to a terminal disclaimer.

(21) Appl. No.: 18/396,554

(22) Filed: Dec. 26, 2023

(65) Prior Publication Data

US 2025/0098365 A1 Mar. 20, 2025

(30) Foreign Application Priority Data

Sep. 15, 2023 (CN) .......................... 202311196116.2
Sep. 15, 2023 (CN) ......................... 202322518871.X

(51) Int. Cl.
*H10F 77/00* (2025.01)
*H10F 19/80* (2025.01)
*H10F 55/155* (2025.01)

(52) U.S. Cl.
CPC ........... *H10F 77/935* (2025.01); *H10F 19/80* (2025.01); *H10F 55/155* (2025.01)

(58) Field of Classification Search
CPC ....... H10F 77/935; H10F 55/155; H10F 19/80
See application file for complete search history.

(56) References Cited

U.S. PATENT DOCUMENTS 12,113,139 B1 \* 10/2024 Zhang ................... H10F 77/211
2010/0065117 A1 \* 3/2010 Kim ........................ H10F 77/70
257/E31.13

(Continued)

FOREIGN PATENT DOCUMENTS

CN 102403371 B 12/2015
CN 111357120 A 6/2020

(Continued)

OTHER PUBLICATIONS

Du (CN 112701192 A, Machine Translation) 2021 (Year: 2021).\*

(Continued)

*Primary Examiner* — Devina Pillay
(74) *Attorney, Agent, or Firm* — USCH Law, PC

(57) ABSTRACT

The solar cell includes a substrate having electrode regions and non-electrode regions defined alternatively, where a surface of the electrode regions has a first surface structure, a surface of the non-electrode regions has a second surface structure, the first surface structure has a smaller roughness than the second surface structure, and the second surface structure includes multiple first protrusion structures. The solar cell further includes a tunneling dielectric layer, and a first doped conductive layer arranged on the tunneling dielectric layer. The solar cell further includes a passivation layer arranged on the non-electrode regions and the first doped conductive layer and a first electrode arranged in the electrode regions. The first electrode penetrates the passivation layer to be in electrical contact with the first doped conductive layer.

14 Claims, 6 Drawing Sheets

(56)          References Cited

U.S. PATENT DOCUMENTS

| 2022/0029040 A1* | 1/2022 | Yin | ..................... H10F 77/311 |
| 2023/0088548 A1 | 3/2023 | Yu et al. | |

FOREIGN PATENT DOCUMENTS

| CN | 210897294 | U |   | 6/2020 | |
| CN | 111628049 | A |   | 9/2020 | |
| CN | 112164729 | A |   | 1/2021 | |
| CN | 112701192 | A | * | 4/2021 | ........... H01L 31/068 |
| CN | 214477492 | U |   | 10/2021 | |
| CN | 113707734 | A |   | 11/2021 | |
| CN | 113948589 | A |   | 1/2022 | |
| CN | 114613865 | A | * | 6/2022 | |
| CN | 115513339 | A |   | 12/2022 | |
| CN | 218769554 | U |   | 3/2023 | |
| CN | 116314372 | A |   | 6/2023 | |
| CN | 115172477 | B |   | 8/2023 | |
| EP | 3457448 | B1 |   | 6/2022 | |
| KR | 20160097926 | A | * | 8/2016 | |

OTHER PUBLICATIONS

Li (CN 114613865, Machine Translation) 2022 (Year: 2022).*
Lee (KR 20160097926 A, Machine Translation) 2016 (Year: 2016).*
Jinko Solar Co., Ltd. et al., Extended European Search Report, EP 23220220.0, Jun. 5, 2024, 12 pgs.
Jinko Solar Co., Ltd. et al., Extended European Search Report, EP 23220573.2, May 28, 2024, 7 pgs.
Jinko Solar Co., Ltd. et al., Extended European Search Report, EP 24156661.1, Jul. 16, 2024, 9 pgs.

* cited by examiner

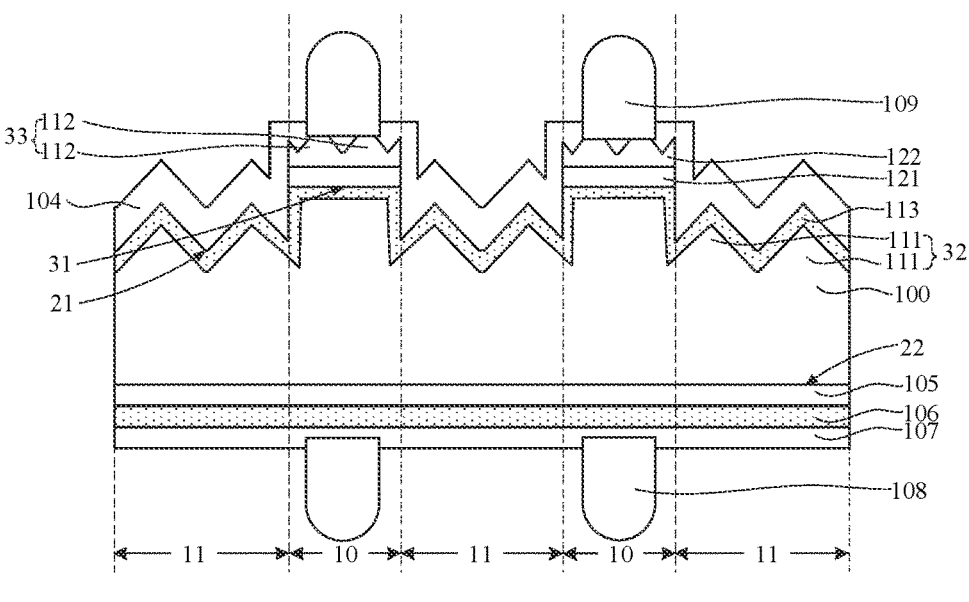
FIG. 6
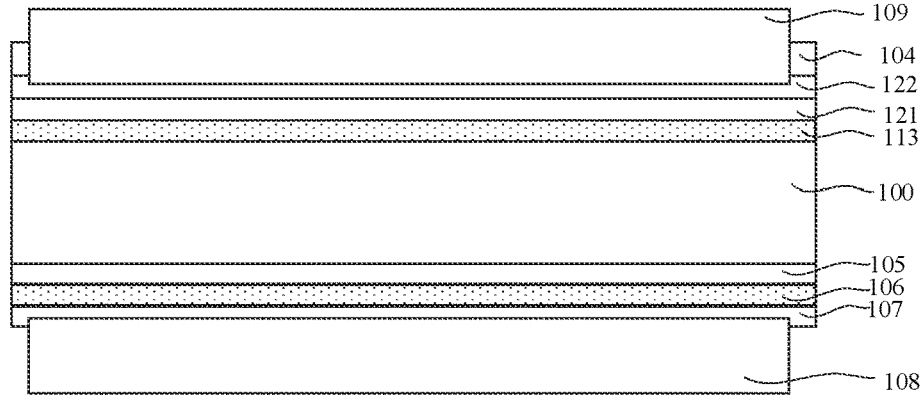
FIG. 7
FIG. 8

SOLAR CELL, METHOD FOR PREPARING THE SAME, AND PHOTOVOLTAIC MODULE

CROSS-REFERENCE TO RELATED APPLICATION

The present application claims the benefit of priority under the Paris Convention to Chinese Patent Application No. 202322518871.X filed on Sep. 15, 2023, and Chinese Patent Application No. 202311196116.2 filed on Sep. 15, 2023, each of which is incorporated herein by reference in its entirety.

TECHNICAL FIELD

Embodiments of the present application relate to the technical field of photovoltaics, and in particular to a solar cell, a method for preparing the same, and a photovoltaic module.

BACKGROUND

Currently, with the gradual depletion of fossil fuels, solar cells are becoming increasingly widely used as a new energy alternative. A solar cell is a device that converts the light energy of the sun into electrical energy. The solar cell uses the principle of photovoltaics to generate charge carriers, which are then extracted using electrodes to effectively utilize electrical energy.

The solar cells in the conventional art mainly include intersected back contact (IBC) cells, tunnel oxide passivated contact (TOPCON) cells, passivated emitter and real cells (PERC), and heterojunction cells. By using different film layer settings and functional limitations to reduce optical loss and reduce the recombination of photo generated carriers on surfaces and inside a silicon substrate, the photovoltaic conversion efficiency of the solar cell can be improved.

However, in operations of preparing a solar cell, due to the different film layer settings and coordination relationships in different regions, multiple masks and etchings are required to obtain more accurate structures, resulting in a cumbersome preparation method for the entire solar cell, which limits the further improvement of solar cell efficiency.

SUMMARY

A solar cell, a method for preparing the solar cell, and a photovoltaic module are provided according to the present application, which is at least beneficial for improving the photoelectric conversion efficiency of the solar cell.

According to some embodiments of the present application, in a first aspect, a solar cell is provided according to the present application, and the solar cell includes a substrate having electrode regions and non-electrode regions defined alternatively, where the electrode regions has a first surface structure, the non-electrode regions has a second surface structure, the first surface structure has a smaller roughness than the second surface structure, and the second surface structure includes multiple first protrusion structures. The solar cell further includes a tunneling dielectric layer formed over the first surface structure, and a first doped conductive layer formed over the tunneling dielectric layer. The solar cell further includes a passivation layer formed over the non-electrode regions and the first doped conductive layer and a first electrode arranged in the electrode regions. The first electrode penetrates the passivation layer to be in electrical contact with the first doped conductive layer.

In some embodiments, a third surface structure is formed over the first doped conductive layer away from the tunneling dielectric layer, the third surface structure includes multiple micro protrusion structures with a smaller size than the multiple first protrusion structures.

In some embodiments, the third surface structure has a greater roughness than the first surface structure.

In some embodiments, the first surface structure has a flat surface.

In some embodiments, a size of the multiple micro protrusion structures is less than 1 μm.

In some embodiments, the multiple micro protrusion structures have a pyramid shape, a sinusoidal curve shape, or a parabolic shape.

In some embodiments, the tunneling dielectric layer and the first doped conductive layer are conformal to the first surface structure.

In some embodiments, the substrate has a first surface and a second surface, the first surface has a first surface structure and a second surface structure opposite to the first surface, and the solar cell further includes: an intrinsic passivation layer arranged on the second surface of the substrate; a second doped conductive layer formed over the intrinsic passivation layer, the first doped conductive layer has a first doping element, the second doped conductive layer has a second doping element, and the first doping element has different conductivity types from the second doping element; and a transparent conductive layer formed over the second doped conductive layer.

In some embodiments, the second surface has a textured structure, and the intrinsic passivation layer, the second doped conductive layer, and the transparent conductive layer are conformal to the textured structure.

In some embodiments, a third doping element in the substrate has a same conductivity type as the first doping element in the first doped conductive layer.

In some embodiments, the solar cell further includes an emitter, where the emitter is arranged in the electrode regions and the non-electrode regions, the emitter is arranged between the substrate and the tunneling dielectric layer, and between the substrate and the passivation layer, and a part of the emitter arranged in the electrode regions is conformal to the first surface structure and a part of the emitter arranged in the non-electrode regions is conformal to the second surface structure.

In some embodiments, the solar cell further includes a doped layer arranged between the surface of the non-electrode regions and the passivation layer, and fourth doping element in the doped layer has a same conductivity as the first doping element of the first doped conductive layer.

In some embodiments, the fourth doping element has a doping concentration less than or equal to the first doping element.

In some embodiments, the solar cell further includes a second electrode, where the second electrode is arranged in the electrode regions to be in electrical contact with the transparent conductive layer.

According to some embodiments of the present application, in a second aspect, a method for preparing a solar cell is further provided according to the present application, the method includes: providing a substrate, where the substrate has electrode regions and non-electrode regions defined alternatively, a surface of the electrode regions has a first surface structure, a surface of the non-electrode regions has a second surface structure. The first surface structure has a smaller roughness than the second surface structure, and the second surface structure includes multiple first protrusion structures. The method further includes forming a tunneling dielectric layer, where the tunneling dielectric layer is configured to cover the first surface structure. The method further includes forming a first doped conductive layer, where the first doped conductive layer is formed over the tunneling dielectric layer, a third surface structure on the side is formed over the first doped conductive layer. The third surface structure includes multiple micro protrusion structures with a smaller size than the multiple first protrusion structures. The method further includes forming a passivation layer, where the passivation layer is arranged in the electrode regions, and the first electrode penetrates the passivation layer to be in electrical contact with the first doped conductive layer. The method further includes forming a first electrode, where the first electrode is arranged in the electrode regions. The first electrode penetrates the passivation layer and makes electrical contact with the first doped conductive layer.

In some embodiments, providing the substrate, forming the tunneling dielectric layer, and forming the first doped conductive layer include: providing an initial substrate, where the initial substrate has an initial surface structure, and the initial substrate has electrode regions and non-electrode regions defined alternatively. The operation further includes forming an initial dielectric layer and a conductive film, where the initial dielectric layer is configured to cover the initial surface structure, and the conductive film is configured to cover the initial dielectric layer. The operation further includes etching the conductive film to form a third surface structure on a surface of the conductive film away from the initial dielectric layer, removing a part of the initial dielectric layer and a part of the conductive film from the non-electrode regions, retaining a part of the initial dielectric layer arranged in the electrode regions as the tunneling dielectric layer, and retaining a part of the conductive film arranged in the electrode regions as the first doped conductive layer. The operation further includes performing texturing treatment on a part of the initial surface structure arranged in the non-electrode regions to form a second surface structure in the non-electrode regions, retaining a part of the initial surface structure arranged in the electrode regions as the first surface structure, and retaining remaining initial substrate as the substrate.

In some embodiments, providing the substrate includes: providing the initial substrate having a textured structure, and the initial substrate has electrode regions and non-electrode regions defined alternatively. The operation further includes removing a part of the textured structure from the electrode regions to form the first surface structure, and retaining a part of the textured structure arranged in the non-electrode regions as the second surface structure.

According to some embodiments of the present application, in a third aspect, a photovoltaic module is further provided according to the present application, and the photovoltaic module includes: at least one cell string formed by connecting multiple solar cells according to any one of above embodiments provided according to the first aspect; at least one encapsulation adhesive film configured to cover the at least one cell string; at least one cover plate configured to cover the at least one encapsulation adhesive film.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated. For more clearly illustrating embodiments of the present application or the technical solutions in the conventional technology, drawings referred to for describing the embodiments or the conventional technology will be briefly described hereinafter. Apparently, drawings in the following description are only examples of the present application, and for the person skilled in the art, other drawings may be acquired based on the provided drawings without any creative efforts.

FIG. 6 is a third cross-sectional view of the solar cell shown in FIG. 1 along A1-A2;

FIG. 7 is a third cross-sectional view of the solar cell shown in FIG. 1 along B1-B2;

FIG. 8 is a fourth cross-sectional view of the solar cell shown in FIG. 1 along A1-A2;

DETAILED DESCRIPTION

It can be seen from the background technology that the photovoltaic efficiency of the solar cell in the conventional art is not desirable.

A solar cell, a method for preparing the solar cell, and a photovoltaic module are provided according to the present application. The electrode regions has a first surface structure, while the non-electrode regions has a second surface structure. In response to the roughness of the first surface structure being less than that of the second surface structure, the high roughness of the surface of the non-electrode regions indicates that the surface of the non-electrode regions has a structure with protrusions and recesses, which can increase the internal reflection of incident light, thereby improving the utilization of light. The low roughness of the surface of the electrode regions indicates that the surface in the electrode regions is relatively flat, resulting in better deposition performance of the tunneling dielectric layer and the first conductive layer deposited on the electrode regions, so that the tunneling dielectric layer and the first conductive layer are enabled to have higher density and better passivation effect to reduce surface defects on the surface in the electrode regions. The first doped conductive layer has a third surface structure on the side away from the tunneling dielectric layer. The third surface structure, as a surface with protrusions and recesses, can increase the reflection of light, thereby improving the utilization rate of light. The third surface structure can further increase the contact region between the first electrode and the first doped conductive layer, which reduces the contact resistance, and improves the contact performance between the first electrode and the first doped conductive layer.

The embodiments of the present application will be described in detail below with reference to the accompanying drawings. However, those of ordinary skill in the art can understand that, in various embodiment of the present application, many technical details are set forth in order to provide the reader with a better understanding of the present application. However, the technical solutions claimed in the present application may be realized even without these technical details and various changes and modifications based on the following embodiments.

Figure 1:
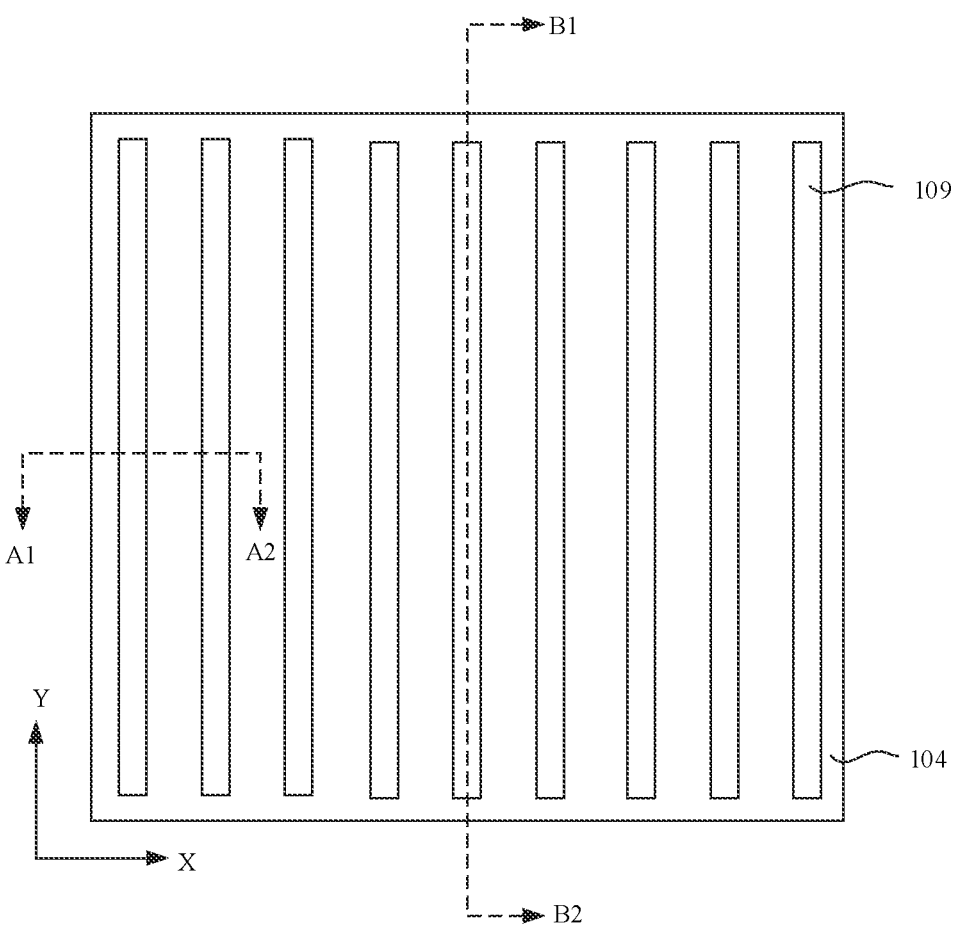
FIG. 1 is a top view of a solar cell provided according to an embodiment of the present application.
Figure 2:
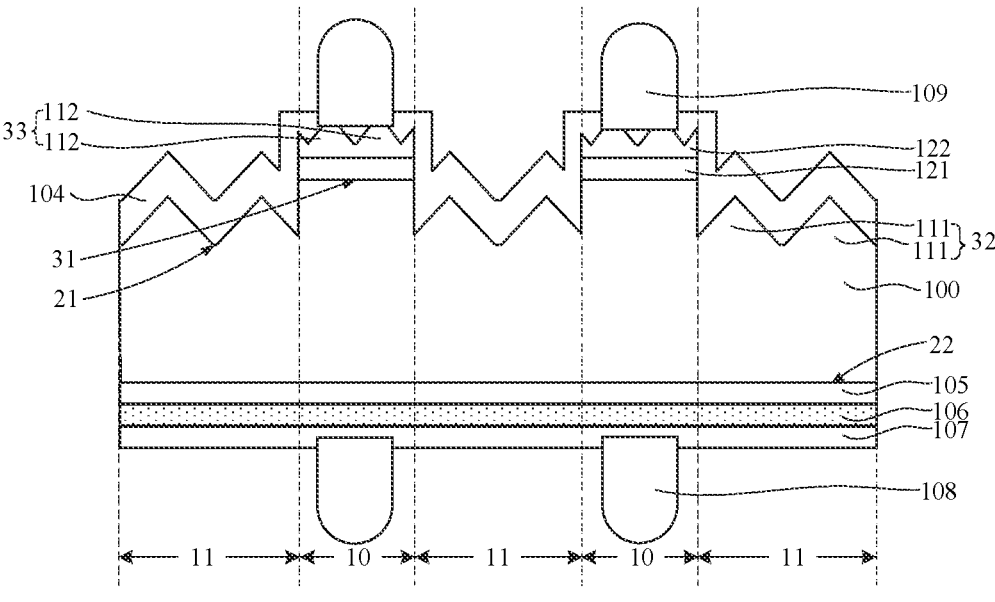
FIG. 2 is a first cross-sectional view of the solar cell shown in FIG. 1 along A1-A2.
Figure 3:
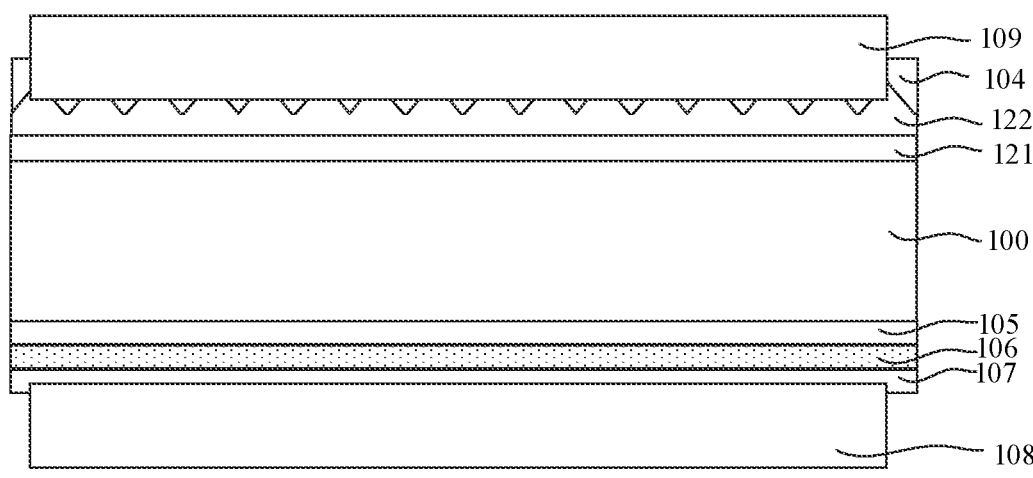
FIG. 3 is a first cross-sectional view of the solar cell shown in FIG. 1 along B1-B2.

FIG. 1 is a top view of a solar cell provided according to an embodiment of the present application. FIG. 2 is a first cross-sectional view of the solar cell shown in FIG. 1 along A1-A2. FIG. 3 is a first cross-sectional view of the solar cell shown in FIG. 1 along B1-B2.

Referring to FIG. 1 to FIG. 3, according to some embodiments of the present application, in the first aspect, a solar cell is provided according to the present application, and the solar cell includes a substrate 100 having electrode regions 10 and non-electrode regions 11 defined alternatively, where a surface of the electrode regions 10 has a first surface structure 31, a surface of the non-electrode regions 11 has a second surface structure 32, the first surface structure 31 has a smaller roughness than the second surface structure 32, and the second surface structure 32 includes multiple first protrusion structures. A third surface structure 33 is formed over the first doped conductive layer 122 away from the tunneling dielectric layer 121, the third surface structure 33 includes multiple micro protrusion structures with a smaller size than the multiple first protrusion structures. The solar cell further includes a tunneling dielectric layer 121 configured to cover the first surface structure 31, and a first doped conductive layer 122 formed over the tunneling dielectric layer 121. The solar cell further includes a passivation layer 104 arranged on the surface of the non-electrode regions 11 and a surface of the first doped conductive layer 122 and a first electrode 109 arranged in the electrode regions 10. The first electrode 109 penetrates the passivation layer 104 to be in electrical contact with the first doped conductive layer 122.

In some embodiments, the material of the substrate 100 is an elemental semiconductor material. Specifically, elemental semiconductor materials are composed of a single element, such as silicon. Among them, the element semiconductor material is in a single crystal state, a polycrystalline state, an amorphous state, or a microcrystalline state (with both single crystal and amorphous states, referred to as microcrystalline state), for example, silicon is at least one of monocrystalline silicon, polycrystalline silicon, amorphous silicon, or microcrystalline silicon.

In some embodiments, the material of the substrate 100 is a compound semiconductor material. Common compound semiconductor materials include but are not limited to materials such as silicon germanide, silicon carbide, gallium arsenide, indium gallide, perovskite, cadmium telluride, copper indium selenium, etc. The substrate 100 may also be a sapphire substrate, a silicon substrate on an insulator, or a germanium substrate on an insulator.

In some embodiments, the substrate 100 is an N-type semiconductor substrate or a P-type semiconductor substrate. The N-type semiconductor substrate is doped with N-type doping elements, which can be any of the V group elements such as phosphorus (P), bismuth (Bi), antimony (Sb), or arsenic (As). The P-type semiconductor substrate is doped with P-type elements, which can be any of the III group elements such as boron (B), aluminum (Al), gallium (Ga), or gallium (In).

In some embodiments, the substrate 100 has a first surface 21 and a second surface 22, and the first surface 21 has a first surface structure 31 and a second surface structure 32.

Referring to FIG. 2, the first surface 21 of the substrate 100 is a front surface and the second surface 22 is a rear surface, or the first surface 21 of the substrate 100 is a rear surface and the second surface 22 is a front surface. That is, the solar cell may be a single-sided cell, in which the front surface serves as a receiving surface for receiving incident light, and the rear surface serves as a rear surface. In some embodiments, the solar cell may be a double-sided cell, where both the first surface 21 and the second surface 22 of the substrate 100 can serve as light receiving surfaces and can be used to receive incident light.

In some embodiments, the electrode regions 10 refers to the region within the substrate 100 that is directly opposite to the first electrode 109 in the thickness direction of the substrate 100, or can be understood as the region where the first electrode 109 is orthogonally projected on the substrate 100. On the contrary, the region within the substrate 100 where the first electrode 109 is not directly opposite is the non-electrode regions 11. The area of electrode region 10 is greater than or equal to the orthogonal projection of the first electrode 109 on the substrate 100, thereby ensuring that the region contacted by the first electrode 109 is only in contact with the electrode regions 10.

It is worth noting that the above definitions of electrode region 10 and non-electrode region 11 are for non-IBC cells, where the two conductive electrodes of different polarities of the solar cell are arranged on opposite sides of the substrate 100, rather than on the same side of the substrate 100. In response to the solar cell being an IBC cell or two conductive electrodes with different polarities being arranged on the same side of the substrate 100, the electrode regions 10 refers to the region where conductive electrode with a polarity is arranged opposite to a conductive electrode with the other polarity, and the non-electrode regions 11 refers to the region where neither polar conductive electrode is arranged opposite to the other.

In some embodiments, referring to FIG. 2, the first surface structure 31 includes a flat surface, which includes a polished surface. In some embodiments, the tunneling dielectric layer 121 and the first doped conductive layer 122 are conformal to the first surface structure 31. In this way, the tunneling dielectric layer 121 and the first doped conductive layer 122 can conform to the morphology of the first surface structure 31, thus having a good passivation effect, so that the surface defects of the first surface of the substrate are reduced, and the deposition effect of the tunneling dielectric layer 121 and the first doped conductive layer 122 is desirable.

It is worth noting that the polished surface refers to the flat surface formed by removing the surface texture by polishing solution or laser etching. After polishing, the surface smoothness of substrate 100 increases, which increases reflection of light with longer wavelength and promotes secondary absorption of projected light, thereby increasing short-circuit current. At the same time, due to the decrease in surface specific surface region of the substrate 100, the surface recombination of substrate 100 is reduced, and the surface passivation effect of substrate 100 can be improved.

It can be understood that a flat surface refers to a relatively flat surface, rather than an absolutely flat surface. Generally, surfaces with a roughness of less than or equal to 5 μm and greater than or equal to −5 μm are characterized as flat surfaces. In addition, the flat surface may also refer to a surface with lower roughness than the first surface structure, the second surface structure, and the third surface structure.

In some embodiments, the second surface structure 32 includes a regular shaped pyramid textured structure and irregularly shaped black silicon. The inclined surface of the second surface structure 32 can increase the internal reflection of incident light, which improves the absorption and utilization of incident light by the substrate 100, thereby improving the efficiency of the solar cell.

The arrangement height and size of at least one first protrusion structure 111 can be within any range known to those skilled in the art, which will not be limited to the embodiments of the present application.

The definition of the size of the protrusion structure obtained by randomly specifying a certain region within the surface range of the substrate 100, detecting the one-dimensional size of the bottom surface of each first protrusion structure 111 within this region, and ultimately taking the average value. It can be seen that the size of the protrusion structure refers to the range of the region average value, not all ranges of the size of the first protrusion structure 111 within the substrate 100, and all ranges of the size of the first protrusion structure are generally greater than the range of the average value. As an example, the morphology of each first protrusion structure 111 in FIG. 2 is the same, the size of the multiple first protrusion structures 111 equal to the average one-dimensional size.

It is worth noting that one-dimensional dimension refers to the distance between two diagonals in the bottom shape of the first protrusion structure 111. In some embodiments, the one-dimensional dimension may also be the distance between the two sides of the bottom shape. Among them, surface of each of the multiple first protrusion structures 111 away from the first surface 21 is fitted to construct a virtual surface as the bottom surface, which is a simulated surface that does not exist in actual solar cell. For example, the second surface structure 32 included in the embodiments of the present application is in compliance with the second surface structure 32, where a part of the first protrusion structure 111 is flush with the bottom surface and a part of the first protrusion structure 111 is higher or lower than the bottom surface.

In some embodiments, the size of the first protrusion structure 111 ranges from 100 nm to 10 μm. The size of the first protrusion structure 111 are 100 nm to 300 nm, 300 nm to 600 nm, 600 nm to 1000 nm, 1 μm to 2 μm, 2 μm to 4 μm, 4 μm to 7 μm, or 7 μm to 10 μm. The height of the first protruding structure 111 is between 100 nm and 10 μm. The height of the first protruding structure 111 is 100 nm to 450 nm, 450 nm to 700 nm, 700 nm to 1700 nm, 1.7 μm to 3.2 μm, 3.2 μm to 6.1 μm, 6.1 μm to 8.5 μm, or 8.5 μm to 10 μm. The size of the first protrusion structure 111 within the above range can ensure that the defects on the first surface 21 of the substrate 100 are small, and the inclined surface of the first protrusion structure 111 can reflect incident light multiple times, thereby improving the utilization rate of light. In addition, the height of the first protrusion structure 111 refers to the vertical distance between the highest point of the first protrusion structure 111 away from the second surface 22 and the bottom surface.

It is worth noting that the difference in roughness here is due to the fact that the height of the texture structure on the surface of the substrate 100 in the non-electrode regions 11 is greater than the height of the texture structure on the surface of the substrate 100 in the electrode regions 10, or the degree of recesses and protrusions on the surface of the substrate 100 in the non-electrode regions 11 is greater than the degree of recesses and protrusions on the surface of the substrate 100 in the electrode regions 10. Roughness refers to the arithmetic mean of the absolute value of the Z-direction deviation relative to the mean line over a sampling length. Roughness can be measured by comparison, light cutting, interferometry, and needle tracing.

In some embodiments, the tunneling dielectric layer 121 and the first doped conductive layer 122 form a passivate contact structure. The first doped conductive layer 122 can form a bending in energy band on the surface of the substrate 100, and the tunneling dielectric layer 121 causes an asymmetric shift in the energy band on the surface of the substrate 100, resulting in a lower barrier for the majority carriers in than for the minority carriers. Therefore, the majority carriers can easily undergo quantum tunneling through the tunneling dielectric layer 121, while the minority carriers are difficult to achieve selective carrier transport through the tunneling dielectric layer 121.

In addition, the tunneling dielectric layer 121 has a chemical passivation effect. Specifically, due to the presence of interface state defects at the interface between the substrate 100 and the tunneling dielectric layer 121, the interface state density on the back of the substrate 100 is relatively high. An increase in the interface state density will promote the recombination of photo generated carriers, which increases the filling factor, short circuit current, and open circuit voltage of the solar cell, and improves the photoelectric conversion efficiency of the solar cell. The tunneling dielectric layer 121 is arranged on the first surface 21 of the substrate 100, so that the tunneling dielectric layer 121 has a chemical passivation effect on the surface of the substrate 100. Specifically, by saturating the hanging bonds of the substrate 100, the defect state density of the substrate 100 is reduced, and the recombination center of the substrate 100 is reduced to lower the carrier recombination rate.

In some embodiments, the material of the tunneling dielectric layer 121 includes at least one of silicon oxide, silicon nitride, silicon nitride, silicon carbide, or magnesium fluoride.

The first doped conductive layer 122 has a field passivation effect. Specifically, an electrostatic field directed towards the interior of the substrate 100 is formed on the surface of the substrate 100, which causes the minority carriers to escape the interface, reduces the concentration of minority carriers, and reduces the recombination rate of carriers at the interface of the substrate 100, thereby increasing the open circuit voltage, short circuit current, and filling factor of the solar cell, and improving the photoelectric conversion efficiency of the solar cell.

The material of the first doped conductive layer 122 includes at least one of amorphous silicon, polycrystalline silicon, or silicon carbide.

The first doped conductive layer 122 is doped with doping elements of the same type as the substrate 100. For example, in response to the type of doping elements in the substrate 100 being P-type, the doping elements in the first doped conductive layer 122 is also P-type. In response to the type of doping elements in the substrate 100 being N-type, the doping elements inside the first doped conductive layer 122 is also N-type.

The concentration of doping elements in the first doped conductive layer 122 is greater than that of the substrate 100, in order to form a sufficiently high potential barrier on the rear surface of the substrate 100, so that majority carriers in the substrate 100 can tunnel through the tunneling dielectric layer 121 to the first doped conductive layer 122.

In some embodiments, the thickness of the tunneling dielectric layer 121 ranges from 0.5 nm to 5 nm. Optionally, the thickness range of the tunneling dielectric layer 121 is from 0.5 nm to 1.3 nm, from 1.3 nm to 2.6 nm, from 2.6 nm to 4.1 nm, or from 4.1 nm to 5 nm. If the tunneling dielectric layer 121 falls within any of the above ranges, the thickness of the tunneling dielectric layer 121 is relatively thin, and majority carriers can easily undergo quantum tunneling through the tunneling dielectric layer 121, while minority carriers are difficult to achieve selective carrier transport through the tunneling dielectric layer 121.

In some embodiments, the third surface structure 33 includes a regular shaped pyramid textured structure and irregularly shaped black silicon. The inclined surface of the third surface structure 33 can increase the internal reflection of incident light, which improves the absorption and utilization of incident light by the substrate 100, thereby improving the efficiency of the solar cell.

In some embodiments, in response to the roughness of the third surface structure 33 being greater than that of the first surface structure 31, the flatness of the first surface structure 31 is better, and the area of the substrate 100 is smaller, resulting in fewer surface defects. In response to the roughness of the third surface structure 33 being large, the contact performance between the first electrode 109 and the first doped conductive layer 122 is better, resulting in a higher welding tension between the first electrode 109 and the first doped conductive layer 122, thereby improving the yield of the solar cell.

In some embodiments, the shape of the micro protrusion structure 112 includes a pyramid shape, a sine curve shape, or a parabolic shape.

It is worth noting that the definition of the size of the micro protrusion structure 112 is the same as the definition of the size of the first protrusion structure 111, which will not be repeated here.

In some embodiments, the size of the micro protrusion structure 112 is less than 1 μm. The size of the micro protrusion structure 112 is less than 890 nm. The size of the micro protrusion structure 112 is less than 760 nm. The size of the micro protrusion structure 112 is less than 620 nm. The size of the micro protrusion structure 112 is less than 500 nm. The size of the micro protrusion structure 112 is less than 320 nm. In this way, if the size of the micro protrusion structure 112 falls within any of the above ranges, and if the size of the micro protrusion structure 112 is small, the etching time and degree of etching of the first doped conductive layer 122 are relatively small, which avoids significant etching losses on the first doped conductive layer 122, thereby ensuring good passivation effect of the first doped conductive layer 122.

In some embodiments, the height of the micro protrusion structure 112 is less than 1 μm. The height of the micro protrusion structure 112 is less than 910 nm. The height of the micro protrusion structure 112 is less than 810 nm. The height of the micro protrusion structure 112 is less than 590 nm. The height of the micro protrusion structure 112 is less than 430 nm. The height of the micro protrusion structure 112 is less than 220 nm. In this way, if the height of the micro protrusion structure 112 is within any of the above ranges, the height of the micro protrusion structure 112 is smaller, the roughness of the third surface structure 33 is smaller. The passivation layer 104 is not only arranged on the recesses of the micro protrusion structure 112, but also on the protrusions of the micro protrusion structure 112, thus providing a better interface composite effect. Among them, the height of the micro protrusion structure 112 refers to the vertical distance between the highest point of the micro protrusion structure 112 away from the first surface 21 and the bottom surface.

In addition, if the height and size of the micro protrusion structure 112 are within the above range, the micro protrusion structure 112 has a large aspect ratio. The inclined surface of the micro protrusion structure 112 can reflect incident light multiple times, thereby improving the utilization rate of light.

In some embodiments, the passivation layer 104 is a single-layer structure or a stacked structure, and the material of the passivation layer 104 is one or more of materials such as silicon oxide, silicon nitride, silicon nitride, carbon nitrogen oxide, titanium oxide, hafnium oxide, or alumina.

In some embodiments, the first electrode 109 is formed by sintering slurry in a burn-through type. The operation of forming the first electrode 109 includes printing metal slurry on the surface of a part of the passivation layer 104 or an anti-reflection layer by a screen-printing process. The metal slurry includes at least one of silver, copper, tin, gold, lead, or nickel. The sintering process is carried out on the metal slurry. In some embodiments, the metal slurry contains materials with high corrosive components such as glass. Therefore, during the sintering process, the corrosive components will corrode the passivation layer 104 or the anti-reflection layer 124, which causes the metal slurry to penetrate into the passivation layer 104 or the anti-reflection layer to be in electrical contact with the first doped conductive layer 122.

The morphology of the passivation layer 104 arranged on the surface of the first doped conductive layer is shown in FIG. 2. The passivation layer 104 can be conformal to the third surface structure 33 or not conformal to the third surface structure 33. The contact between the first electrode 109 and the first doped conductive layer 122 can be partial or complete, for example, as shown in FIG. 2, the first electrode 109 is in contact with a part of the top of the third surface structure 33, or the first electrode 109 is in contact with a complete micro protrusion structure, or the first electrode is not only in complete contact with the micro protrusion structure, but also in contact with a part of the first doped conductive layer 122 arranged at the bottom of the micro protrusion structure.

In some embodiments, referring to FIG. 2 or FIG. 3, the solar cell further includes an intrinsic passivation layer 105 arranged on the second surface of the substrate 100. The solar cell further includes a second doped conductive layer 106 formed over the intrinsic passivation layer 105. The first doped conductive layer 122 has a first doping element, the second doped conductive layer 106 has a second doping element, and the conductivity type of the first doping element is different from that of the second doping element. The solar cell further includes a transparent conductive layer 107 configured to cover the surface of the second doped conductive layer 106.

It can be understood that the transparent conductive layer 107 has conductivity, and charge carriers can sequentially pass through the intrinsic passivation layer, the second doped conductive layer, and the transparent conductive layer and ultimately be collected by the second electrode.

According to some embodiments of the present application, another solar cell is further provided according to the present application, and the solar cell includes a substrate 100 having electrode regions 10 and non-electrode regions 11 defined alternatively, where a surface of the electrode regions 10 has a first surface structure 31, a surface of the non-electrode regions 11 has a second surface structure 32, the first surface structure 31 has a smaller roughness than the second surface structure 32. The solar cell further includes a tunneling dielectric layer 121 configured to cover the first surface structure 31, and a first doped conductive layer 122 formed over the tunneling dielectric layer 121. The solar cell further includes an intrinsic passivation layer 105 arranged on the second surface of the substrate 100. The solar cell further includes a second doped conductive layer 106 formed over the intrinsic passivation layer 105. The first doped conductive layer 122 has a first doping element, the second doped conductive layer 106 has a second doping element, and the conductivity type of the first doping element is different from that of the second doping element. The solar cell further includes a transparent conductive layer 107 configured to cover the surface of the second doped conductive layer 106.

In some embodiments, the interface between the intrinsic passivation layer 105 and the substrate 100 can form a higher open circuit voltage on the one hand, and achieve better passivation effect on the other hand, thereby making it easier to improve conversion efficiency.

In some embodiments, the material of the intrinsic passivation layer 105 includes intrinsic amorphous silicon, silicon oxide, silicon nitride, or silicon carbide. The thickness of the intrinsic passivation layer 105 is greater than or equal to 2 μm and less than or equal to 10 μm, and the thickness is preferably 5 μm.

In some embodiments, the second doped conductive layer 106 includes one of N-type doped or P-type doped amorphous silicon, amorphous silicon oxide, amorphous silicon carbide, microcrystalline silicon, hydrogenated microcrystalline silicon, microcrystalline silicon oxide, microcrystalline silicon carbide, polycrystalline silicon semiconductor thin films, or a composite thin film layers including more than one of the above. The thickness of the second doped conductive layer 106 ranges from 4 nm to 30 nm.

The hydrogenated microcrystalline silicon can bring a larger bandgap and narrower absorption spectrum range, which can effectively improve the photoelectric conversion efficiency of the solar cell. Moreover, as the crystallization rate increases, the series resistance decreases, and the filling factor increases, which improves the output current of the solar cell and effectively extends the service life of the solar cell.

In some embodiments, the transparent conductive layer 107 includes at least one of tin doped indium oxide (ITO), aluminum doped zinc oxide (AZO), cerium doped indium oxide, and tungsten doped indium oxide.

In some embodiments, a PN junction is formed between the second doped conductive layer 106 and the substrate 100. The intrinsic passivation layer 105 is inserted between PN junctions as a buffer layer, and the intrinsic passivation layer 105 has a good passivation effect on the surface of substrate 100, which can greatly avoid carrier recombination and achieve higher minority carrier lifetime and higher open circuit voltage.

In some embodiments, the solar cell further includes a second electrode 108, which is in electrical contact with the transparent conductive layer 107.

In some embodiments, the second electrode 108 is formed by sintering slurry in a burn-through type. The operation of forming the second electrode 108 includes printing metal slurry on the surface of a part of the transparent conductive layer 107 or the anti-reflection layer by a screen-printing process. The metal slurry includes at least one of silver, copper, tin, gold, lead, or nickel. The sintering process is carried out on the metal slurry. In some embodiments, the metal slurry contains materials with high corrosive components such as glass. Therefore, during the sintering process, the corrosive components will corrode the anti-reflection layer, which causes the metal slurry to penetrate into the anti-reflection layer to be in electrical contact with the transparent conductive layer 107.

For the solar cell shown in FIG. 2, the substrate 100 includes one of N-type doping elements and P-type doping elements, and the first doped conductive layer 122 includes the other of N-type doping elements or P-type doping elements. Therefore, a PN junction is formed between the substrate 100 and the first doped conductive layer 122. In response to the PN junction being irradiated by the sun, new pairs of hole and electron are formed. Under the action of an electric field built in the PN junction, photo generated holes flow to the p-region and photo generated electrons flow to the n-region. After the circuit is connected, a current is generated. For example, in response to the substrate 100 being n-type doped, the substrate 100 is the n-region. In response to the first doped conductive layer 122 being p-type doped, the first doped conductive layer 122 is the p-region. The p-type semiconductor has a hole (the p-type semiconductor loses one negatively charged electron, which can be considered as an additional positive charge), and the potential difference between the p-type semiconductor and the n-type semiconductor is one more free electron to generate electricity. Therefore, when sunlight irradiating, light energy excites electrons in silicon atoms (photoelectric effect), resulting in convection of electrons and holes. These electrons and holes are affected by the built-in potential and gather in the n region and p region, respectively. At this time, the external is connected through electrodes to form a circuit to generate current.

Figure 4:
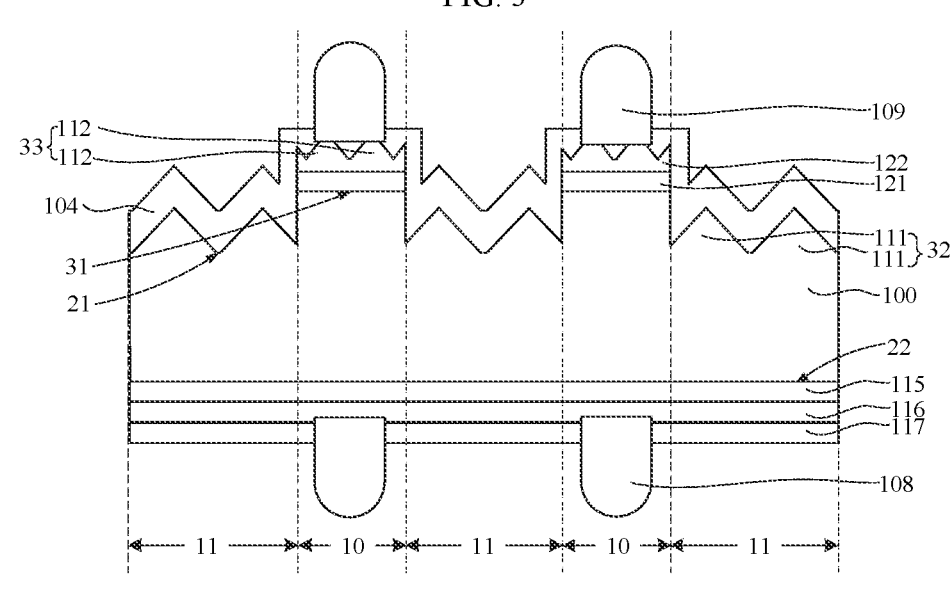
FIG. 4 is a second cross-sectional view of the solar cell shown in FIG. 1 along A1-A2.
Figure 5:
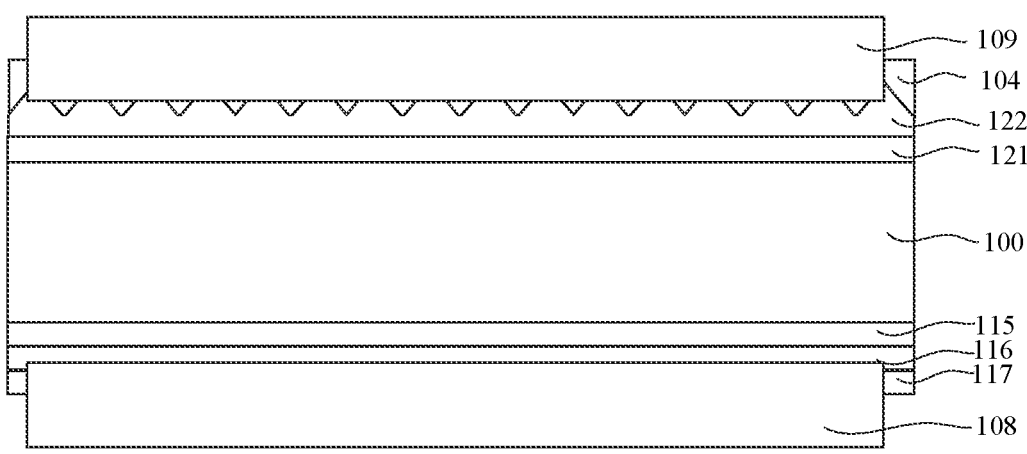
FIG. 5 is a second cross-sectional view of the solar cell shown in FIG. 1 along B1-B2.

In some embodiments, referring to FIG. 4 and FIG. 5, FIG. 4 is a second cross-sectional view of the solar cell shown in FIG. 1 along A1-A2. FIG. 5 is a second cross-sectional view of the solar cell shown in FIG. 1 along B1-B2. The solar cell further includes: a first tunneling dielectric layer 115 configured to cover the second surface 22, a third doped conductive layer 116 formed over the first tunneling dielectric layer 115, and a first passivation layer 117 formed over the third doped conductive layer 116. The second electrode 108 penetrates the first passivation layer 117 to be in electrical contact with the third doped conductive layer 116.

In some embodiments, the setting and effect of the material and thickness of the first tunneling dielectric layer 115 refer to the setting and effect of the material and thickness of the tunneling dielectric layer 121 shown in FIG. 2. The setting and effect of the material and thickness of the third doped conductive layer 116 refer to the setting and effect of the material and thickness of the first doped conductive layer 122 shown in FIG. 2, which will not be repeated here.

In some embodiments, the first passivation layer 117 is a single-layer structure or a stacked structure, and the material of the first passivation layer 117 is one or more of materials such as silicon oxide, silicon nitride, silicon nitride, silicon nitride, titanium oxide, hafnium oxide, or alumina.

In some embodiments, the second surface 22 has a textured structure. The intrinsic passivation layer 105, the second doped conductive layer 106, and the transparent conductive layer 107 are conformal to the textured structure. By increasing the light utilization rate of the second surface 22 through the textured structure, the amount of light received by the substrate 100 is increased, thereby improving the photoelectric conversion efficiency of the solar cell.

In some embodiments, the conductivity type of the third doping element within the substrate 100 is the same as that of the first doping element in the first doped conductive layer 122. The passivation contact structure and high-low junction are formed between the substrate 100 and the first doped conductive layer 122, which promotes the migration of charge carriers within the substrate 100 to the first doped conductive layer 122 under the action of the built-in electric field, and the carriers are absorbed by the electrode, which is conducive to improving the efficiency of the solar cell.

In some embodiments, referring to FIG. 6 and FIG. 7, FIG. 6 is a third cross-sectional view of the solar cell shown in FIG. 1 along A1-A2. FIG. 7 is a third cross-sectional view of the solar cell shown in FIG. 1 along B1-B2. The solar cell further includes an emitter 113, which is arranged in the electrode regions 10 and the non-electrode regions 11. The emitter 113 is arranged between the substrate 100 and the tunneling dielectric layer 121, as well as between the substrate 100 and the passivation layer 104. The emitter 113 is conformal to the first surface structure 31 and the second surface structure 32.

In some embodiments, a PN junction is formed between the emitter 113 and the substrate 100, and the conductivity type of the first doping element in the first doped conductive layer 122 is the same as that of the fifth doping element in the emitter 113.

In some embodiments, referring to FIG. 8, FIG. 8 is fourth cross-sectional view of the solar cell shown in FIG. 1 along A1-A2. The solar cell further includes a doped layer 114, which is arranged between the surface of the substrate 100 in the non-electrode regions 11 and the passivation layer 104. The conductivity type of the fourth doping element in the doped layer 114 is the same as that of the first doping element in the first doped conductive layer 122.

In some embodiments, the doped layer and the first doped conductive layer 122 can jointly form a PN junction with the substrate 100 as a whole. The doped layer 114 and the first doped conductive layer 122 can also serve as a part of the passive contact structure, which improves the transmission efficiency of carriers by constructing a high-low junction with the substrate 100.

In some embodiments, the material of the doped layer 114 includes at least one of microcrystalline silicon, amorphous silicon, polycrystalline silicon, or silicon carbide.

In some embodiments, in response to a fourth concentration of the fourth doping element being smaller or equal to a first concentration of the first doping concentration of the first doping element, the doping concentration of the doping layer 114 corresponding to the non-electrode regions 11 is lower, and the composite effect is relatively small. The doping concentration of the first doped conductive layer 122 corresponding to the electrode regions 10 is higher, and the contact resistance between the first electrode 109 and the first doped conductive layer 122 is smaller. More doping elements can also serve as carriers, which improves the transmission efficiency of the solar cell.

It can be understood that the first doped conductive layer 122 and the doped layer 114 can have partial contact or complete contact between side surfaces, or partial contact or complete contact between a top surface and a bottom surface.

The embodiment of the present application provides a solar cell. The surface of the electrode regions 10 has a first surface structure 31, while the surface of the non-electrode regions 11 has a second surface structure 32. In response to the roughness of the first surface structure 31 being less than that of the second surface structure 32, the high roughness of the surface of the non-electrode regions 11 indicates that the surface of the non-electrode regions 11 has a structure with protrusions and recesses, which can increase the internal reflection of incident light, thereby improving the utilization of light. The low roughness of the surface of the electrode regions 10 indicates that the surface in the electrode regions 10 is relatively flat, resulting in better deposition performance of the tunneling dielectric layer 121 and the first conductive layer 122 deposited on the electrode regions, so that the tunneling dielectric layer 121 and the first conductive layer 122 are enabled to have higher density and better passivation effect to reduce surface defects on the surface in the electrode regions 10. The first doped conductive layer 122 has a third surface structure 33 on the side away from the tunneling dielectric layer 121. The third surface structure 33, as a surface with protrusions and recesses, can increase the reflection of light, thereby improving the utilization rate of light. The third surface structure 33 can further increase the contact region between the first electrode 109 and the first doped conductive layer 122, which reduces the contact resistance, and improves the contact performance between the first electrode 109 and the first doped conductive layer 122.

Figures 9, 10, 11:
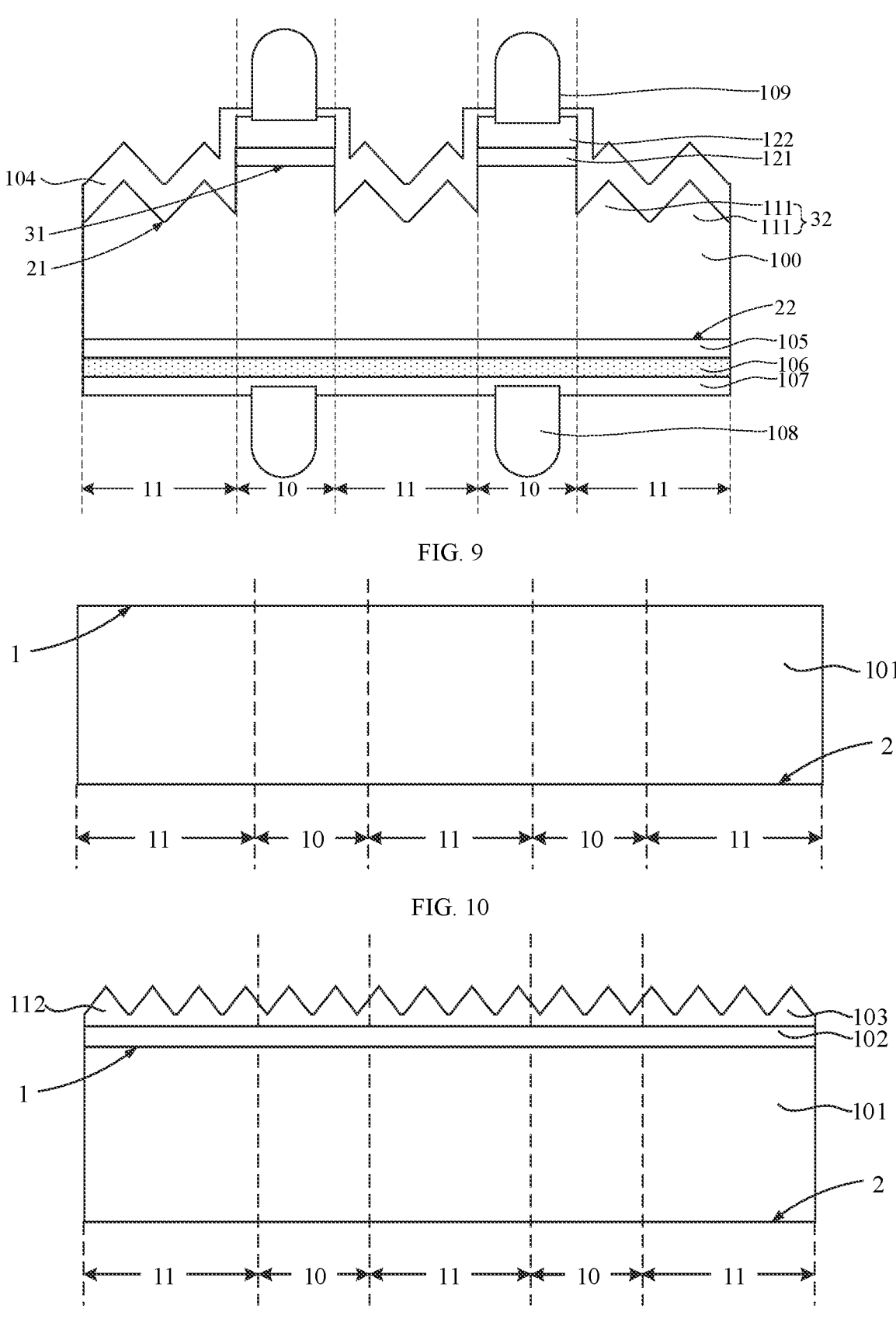
FIG. 9 is a fifth cross-sectional view of the solar cell shown in FIG. 1 along A1-A2.
FIG. 10 to FIG. 14 are schematic structural views of a solar cell corresponding to each operation in a method for preparing the solar cell provided according to an embodiment of the present application.

FIG. 9 is a fifth cross-sectional view of the solar cell shown in FIG. 1 along A1-A2. Referring to FIG. 9, according to some embodiments of the present application, in the first aspect, a solar cell is provided according to the present application, and the solar cell includes a substrate 100 having electrode regions 10 and non-electrode regions 11 defined alternatively, where a surface of the electrode regions 10 has a first surface structure 31, a surface of the non-electrode regions 11 has a second surface structure 32, the first surface structure 31 has a smaller roughness than the second surface structure 32, and the second surface structure 32 includes multiple first protrusion structures. The solar cell further includes a tunneling dielectric layer 121 configured to cover the first surface structure 31, and a first doped conductive layer 122 formed over the tunneling dielectric layer 121. The solar cell further includes a passivation layer 104 arranged on the surface of the non-electrode regions 11 and a surface of the first doped conductive layer 122 and a first electrode 109 arranged in the electrode regions 10. The first electrode 109 penetrates the passivation layer 104 to be in electrical contact with the first doped conductive layer 122. Reference of the intrinsic passivation layer 105, the second doped conductive layer 106, the transparent conductive layer 107, and the second electrode 108 can be made back to above embodiments, which will not be repeated here.

Correspondingly, according to some embodiments of the present application, in the second aspect, a method for preparing a solar cell is further provided according to the present application, which can be used to prepare the solar cell provided according to the above embodiments. The same or corresponding technical features as the above embodiments will not be repeated here.

FIG. 10 to FIG. 14 are schematic structural views of a solar cell corresponding to each operation in a method for preparing the solar cell provided according to an embodiment of the present application.

Referring to FIG. 10 to FIG. 13, the method includes: providing a substrate 100, where the substrate 100 has electrode regions 10 and non-electrode regions 11 defined alternatively, a surface of the electrode regions 10 has a first surface structure 31, a surface of the non-electrode regions 11 has a second surface structure 32. The first surface structure 31 has a smaller roughness than the second surface structure 32, and the second surface structure 32 includes multiple first protrusion structures 111. The method further includes forming a tunneling dielectric layer 121, where the tunneling dielectric layer 121 is configured to cover the first surface structure 31. The method further includes forming a first doped conductive layer 122, where the first doped conductive layer 122 is formed over the tunneling dielectric layer 121. The method further includes forming a passivation layer, where the passivation layer is arranged in the electrode regions, and the first electrode penetrates the passivation layer to be in electrical contact with the first doped conductive layer.

In some embodiments, the method further includes forming a third surface structure 33 on a side of the first doped conductive layer 122 away from the tunneling dielectric layer 121. The third surface structure 33 includes multiple micro protrusion structures with a smaller size than the multiple first protrusion structures 111.

In some embodiments, the operation of forming a substrate 100, a tunneling dielectric layer 121, and a first doped conductive layer 122 include: referring to FIG. 10, providing an initial substrate 101 with an initial surface structure, and the initial substrate 101 has electrode regions 10 and non-electrode regions 11 defined alternatively.

In some embodiments, the initial substrate 101 has a first surface 1 and a second surface 2. The first surface 1 has an initial surface structure that includes a flat surface.

In some embodiments, the initial substrate 101 is subjected to surface smoothing treatment to remove some impurities and surface defects from the initial substrate surface, thereby improving the surface performance of the initial substrate. The first surface 1 of the initial substrate 101 after the surface smoothing treatment is performed has an initial surface structure.

If the solar cell shown in FIG. 6 is formed, before forming the initial dielectric layer, the method further includes performing diffusion treatment on the first surface 1 of the initial substrate 101 to form a diffusion layer, so that a part of the initial substrate 101 along the thickness direction is converted into an emitter, that is, the surface of the emitter is the first surface of the substrate 100. Among them, the diffusion layer serves as the emitter.

In some embodiments, the operation of forming an emitter includes forming a doped seed layer on a first side of the initial substrate 101 by a deposition process, and diffusing doping elements in the doped seed layer into the initial substrate by annealing or laser doping, so that a part of the initial substrate 101 with doping elements is converted into a diffusion layer.

Referring to FIG. 10, an initial dielectric layer 102 and a conductive film 103 are formed, the initial dielectric layer 102 is configured to cover the initial surface structure, and the conductive film 103 is formed over the initial dielectric layer 103.

In some embodiments, an initial dielectric layer 102 and a conductive film 103 are formed by a deposition process, which includes either atomic layer deposition or chemical vapor deposition.

The material of conductive film 103 as polycrystalline silicon is taken as an example, in some embodiments, the method for forming conductive film 103 includes: forming an intrinsic polycrystalline silicon layer on a surface of the initial dielectric layer 102 by a deposition process. For example, an atomic layer deposition process can be used to form an intrinsic polycrystalline silicon layer. Next, the intrinsic polycrystalline silicon layer is doped with doping elements to form a conductive film 103.

In some embodiments, the doping process includes depositing a doping source on a surface of the intrinsic polycrystalline silicon layer, and the doping source includes a first doping element. In some embodiments, the first doping element can be an N-type doping element. In some embodiments, the N-type doping source can be a single substance or compound containing pentavalent elements, such as phosphorus or a compound containing phosphorus, such as phosphorus trichloride.

In response to depositing a doping source on the rear surface of the substrate 100, oxygen is simultaneously introduced and heated to push the first doping element in the doping source into the intrinsic polycrystalline silicon layer, to form the conductive film 103.

Reference is made back to FIG. 10, the etching process is carried out on the conductive film 103 to ensure that the surface of the conductive film 103 away from the initial dielectric layer 102 has a third surface structure, which includes at least one micro protrusion structure 112.

In some embodiments, the etching process includes solution etching process and laser etching process.

Referring to FIG. 11, a mask layer is formed on the surface of the conductive film 103 in the electrode regions 10. The material of the mask layer includes organic wax, metal, or silica mask.

In some embodiments, a mask layer is formed using a printing process.

In some embodiments, the operation of forming a mask layer containing organic wax includes heating organic wax with a melting temperature between 40 and 150 degrees Celsius to melt, and printing a single or multiple layers of organic wax on the electrode regions 10 of the solar cell by inkjet printing or printing to form a mask layer. Among them, the organic wax is insoluble in water and has certain corrosion and dissolution resistance for wet treatment solutions that remove a part of the conductive film 103 in the non-electrode regions 11.

Referring to FIG. 11, the initial dielectric layer and the conductive film in the non-electrode regions 11 is removed, the initial dielectric layer in the electrode regions 10 is retained as the tunneling dielectric layer 121, and the conductive film in the electrode regions 10 is retained as the first doped conductive layer 122. The mask layer is removed.

In some embodiments, the initial dielectric layer and the conductive film in the non-electrode regions are removed by wet etching solution.

In some embodiments, the operation of removing the mask layer containing organic wax includes heating the solar cell above the melting temperature of the organic wax to melt, and using airflow or water flow to completely or partially remove the mask layer from the solar cell.

In some embodiments, the wet etching process is further used to remove the mask layer. For example, the organic wax that forms a patterned mask can be soluble in specific acids, bases, or organic solvents, and can be removed using the corresponding acids, bases, or organic solvents after the production of the solar cell. The wet etching process further includes a fourth etching solution, which is used to remove the mask layer.

Figures 12, 13, 14:
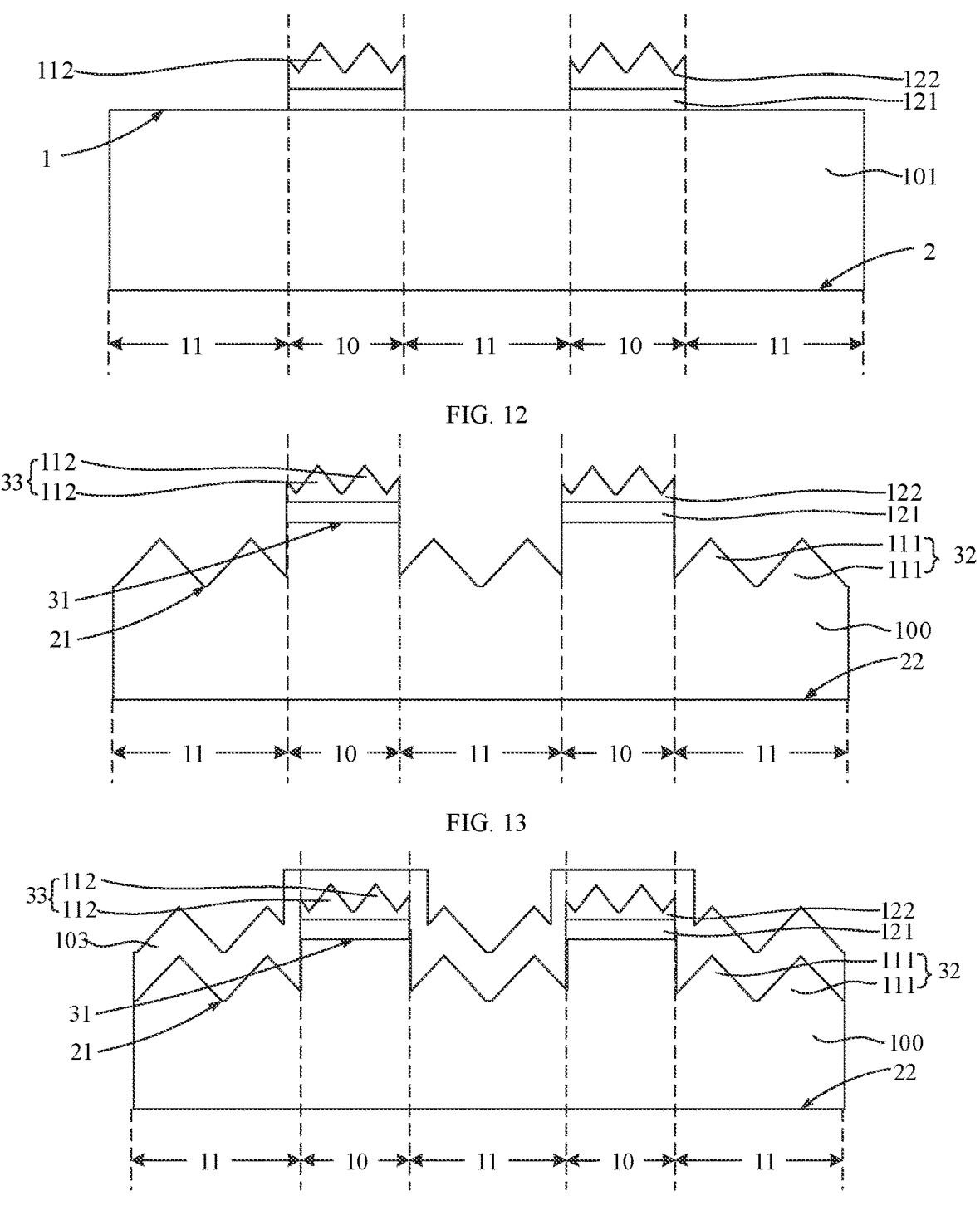

Referring to FIG. 12, the initial surface structure of the non-electrode regions 11 is textured to form a second surface structure 32 on the surface of the substrate 100 of the non-electrode regions 11. The initial surface structure of the electrode regions 10 is retained as the first surface structure 31, and the remaining initial substrate 101 is used as the substrate 100.

Referring to FIG. 13, a passivation layer 104 is formed, which is arranged on the surface of the substrate 100 in the non-electrode regions 11 and the surface of the first doped conductive layer 122.

Referring to FIG. 2, a first electrode 109 is formed, which is arranged in the electrode regions 10. The first electrode 109 penetrates the passivation layer 104 to be in electrical contact with the first doped conductive layer 122.

In some embodiments, the operation of forming the first electrode 109 includes printing metal slurry on the surface of a part of the passivation layer 104 or an anti-reflection layer by a screen-printing process. The metal slurry includes at least one of silver, copper, tin, gold, lead, or nickel. The sintering process is carried out on the metal slurry. In some embodiments, the metal slurry contains materials with high corrosive components such as glass. Therefore, during the sintering process, the corrosive components will corrode the passivation layer 104 or the anti-reflection layer 124, which causes the metal slurry to penetrate into the passivation layer 104 or the anti-reflection layer to be in electrical contact with the first doped conductive layer 122.

Reference is made back to FIG. 2, the method further includes: forming an intrinsic passivation layer 105 on the second surface of the substrate 100, forming a second doped conductive layer 106 on a side of the intrinsic passivation layer 105. The first doped conductive layer 122 has a first doping element, the second doped conductive layer 106 has a second doping element, and the conductivity type of the first doping element is different from that of the second doping element. The method further includes forming a transparent conductive layer 107 configured to cover the surface of the second doped conductive layer 106, and forming a second electrode 108 in electrical contact with the transparent conductive layer 107.

In some embodiments, the method of forming the second electrode 108 includes printing metal slurry on the surface of a part of the transparent conductive layer 107 or the anti-reflection layer by a screen-printing process. The metal slurry includes at least one of silver, copper, tin, gold, lead, or nickel. The sintering process is carried out on the metal slurry. In some embodiments, the metal slurry contains materials with high corrosive components such as glass. Therefore, during the sintering process, the corrosive components will corrode the anti-reflection layer, which causes the metal slurry to penetrate into the anti-reflection layer to be in electrical contact with the transparent conductive layer 107.

In some embodiments, the operation of providing a substrate includes providing an initial substrate with a textured surface, and the initial substrate has electrode regions and non-electrode regions defined alternatively. The operation further includes removing the textured structure in the electrode regions and form the first surface structure, and retaining the textured structure in the non-electrode regions as the second surface structure.

Figure 15:
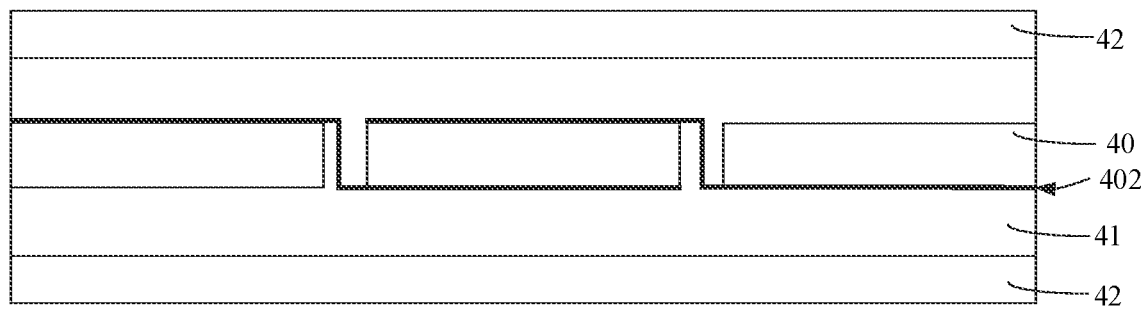
FIG. 15 is a schematic structural view of a photovoltaic module provided according to an embodiment of the present application.

FIG. 15 is a cross-sectional view of a photovoltaic module provided according to an embodiment of the present application.

Correspondingly, according to some embodiments of the present application, in a third aspect, a photovoltaic module is further provided according to the present application, and the photovoltaic module includes: at least one cell string formed by connecting multiple solar cells 40 according to any one of above embodiments provided according to the first aspect, at least one encapsulation adhesive film 41 configured to cover the at least one cell string, and at least one 42 cover plate configured to cover the at least one encapsulation adhesive film 41.

Specifically, in some embodiments, multiple cell strings can be electrically connected through conductive strips 402. FIG. 14 only illustrates the positional relationship between solar cells, where the electrodes with the same polarity are arranged in the same direction or with positive polarity for each cell towards the same side, so that the conductive strips are connected to different sides of two adjacent cells. In some embodiments, the solar cells can also be arranged in order of electrodes with different polarities facing the same side, that is, the electrodes of adjacent multiple solar cells are sorted in order of first polarity, second polarity, and first polarity, and the conductive strips are connected to two adjacent solar cells on the same side.

In some embodiments, there is no distance between the solar cells, that is, the solar cells overlap with each other.

In some embodiments, the encapsulation adhesive film 41 includes a first encapsulation adhesive film and a second encapsulation adhesive film. The first encapsulation adhesive film is configured to cover one of the front surface and rear surface of the solar cell 40, and the second encapsulation adhesive film is configured to cover the other of the front surface and rear surface of the solar cell 40. Specifically, at least one of the first encapsulation adhesive film or second encapsulation adhesive film is an organic encapsulation adhesive film such as polyvinyl butyral (PVB) adhesive film, ethylene vinyl acetate copolymer (EVA) film, polyethylene octene co elastomer (POE) film, or polyethylene terephthalate (PET) film.

It can be understood that there is a boundary between the first encapsulation adhesive film and the second encapsulation adhesive film before lamination. After lamination, there is no concept about the first encapsulation adhesive film and the second encapsulation adhesive film anymore, that is, the first encapsulation adhesive film and the second encapsulation adhesive film have already formed the overall encapsulation adhesive film 41 as a whole.

In some embodiments, the at least one cover plate 42 is a glass cover plate, a plastic cover plate, or other cover plates with light transmission function. Specifically, the surface of the cover plate 42 opposite to the at least one encapsulation adhesive film 41 has a surface with protrusions and recesses, thereby increasing the utilization of incident light. The at least one cover plate 42 includes a first cover plate and a second cover plate. The first cover plate is arranged opposite to the first encapsulation adhesive film, and the second cover plate is arranged opposite to the second encapsulation adhesive film.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Although the present application is disclosed as a preferred embodiment, it is not intended to limit the claims. Any person skilled in the art may make several possible changes and modifications without departing from the concept of the present application. Therefore, the scope of protection of the present application should be based on the scope defined in the claims of the present application. In addition, the embodiments of the present application specification and the accompanying drawings are only illustrative examples and are not the entire scope protected by the claims of the present application.

Those of ordinary skill in the art can understand that the above embodiments are specific embodiments of the present application, and in practical applications, various changes may be made in form and details without deviating from the spirit and scope of the present application. Any one of ordinary skills in the art may make various changes and modifications without departing from the spirit and scope of the present application. Therefore, the scope of protection of the present application shall be subject to the scope limited by the claims.

What is claimed is:

1. A solar cell, comprising:
a substrate having electrode regions and non-electrode regions, wherein the electrode regions are arranged alternatingly with the non-electrode regions, each of the electrode regions has a first surface structure, each of the non-electrode regions has a second surface structure, the electrode regions have surface roughness less than surface roughness of the non-electrode regions, and the second surface structure includes a plurality of first protrusion structures;
a tunneling dielectric layer formed over the first surface structure;
a first doped conductive layer formed over the tunneling dielectric layer and has a first doping element of a first conductivity type;
a passivation layer formed over the non-electrode regions and the first doped conductive layer;
a plurality of first electrodes formed over respective ones of the electrode regions, wherein the plurality of first electrodes penetrate the passivation layer to be in electrical contact with the first doped conductive layer; and
a doped layer formed between the non-electrode regions and the passivation layer, wherein the doped layer has a doping element of the first conductivity type, and the doped layer is in electrical contact with the first doped conductive layer.

2. The solar cell according to claim 1, wherein the tunneling dielectric layer and the first doped conductive layer are conformal to the first surface structure.

3. The solar cell according to claim 1, wherein doping concentration of the doping element in the doped layer is less than or equal to doping concentration of the first doping element.

4. The solar cell according to claim 1, wherein the tunneling dielectric layer has a thickness of 0.5 nm to 5 nm.

5. The solar cell according to claim 1, wherein a third surface structure is formed over the first doped conductive layer, the third surface structure includes a plurality of micro protrusion structures with a smaller size than the plurality of first protrusion structures.

6. The solar cell according to claim 5, wherein a size of the plurality of micro protrusion structures is less than 1 μm.

7. The solar cell according to claim 5, wherein the plurality of micro protrusion structures have a pyramid shape, a sinusoidal curve shape, or a parabolic shape.

8. The solar cell according to claim 5, wherein the third surface structure has surface roughness greater than the first surface structure.

9. The solar cell according to claim 8, wherein the first surface structure has a flat surface.

10. The solar cell according to claim 1, wherein the substrate has a first surface and a second surface, the first surface has the first surface structure and the second surface structure, and the solar cell further includes:
an intrinsic passivation layer formed on the second surface of the substrate;
a second doped conductive layer formed over the intrinsic passivation layer, wherein the second doped conductive layer has a second doping element of a second conductivity type different from the first conductivity type; and
a transparent conductive layer formed over the second doped conductive layer.

11. The solar cell according to claim 10, wherein the second surface has a textured structure, and the intrinsic passivation layer, the second doped conductive layer, and the transparent conductive layer are conformal to the textured structure.

12. The solar cell according to claim 10, further including a second electrode, wherein the second electrode is arranged in the electrode regions to be in electrical contact with the transparent conductive layer.

13. The solar cell according to claim 12, further including a first tunneling dielectric layer configured to cover the second surface, a third doped conductive layer formed over the first tunneling dielectric layer, and a first passivation layer formed over the third doped conductive layer, wherein the second electrode penetrates the first passivation layer to be in electrical contact with the third doped conductive layer.

14. A photovoltaic module, comprising:
at least one cell string formed by connecting a plurality of solar cells according to claim 1;
at least one encapsulation adhesive film configured to cover the at least one cell string; and
at least one cover plate configured to cover the at least one encapsulation adhesive film.

* * * * *